(12) United States Patent
Forrest et al.

(10) Patent No.: US 11,538,953 B2
(45) Date of Patent: Dec. 27, 2022

(54) STACKED COMPOUND PARABOLIC CONCENTRATORS INTEGRATED WITH MULTIPLE DIELECTRIC LAYERS FOR WIDE ACCEPTANCE ANGLE

(71) Applicant: THE REGENTS OF THE UNIVERSITY OF MICHIGAN, Ann Arbor, MI (US)

(72) Inventors: Stephen R. Forrest, Ann Arbor, MI (US); Kyusang Lee, Ann Arbor, MI (US); Byungjun Lee, Ann Abor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 682 days.

(21) Appl. No.: 16/076,825

(22) PCT Filed: Feb. 22, 2017

(86) PCT No.: PCT/US2017/018865
§ 371 (c)(1),
(2) Date: Aug. 9, 2018

(87) PCT Pub. No.: WO2017/147144
PCT Pub. Date: Aug. 31, 2017

(65) Prior Publication Data
US 2019/0044014 A1    Feb. 7, 2019

Related U.S. Application Data

(60) Provisional application No. 62/298,162, filed on Feb. 22, 2016.

(51) Int. Cl.
*H01L 31/054* (2014.01)
*H01L 31/042* (2014.01)
(Continued)

(52) U.S. Cl.
CPC ........ *H01L 31/0547* (2014.12); *H01L 31/042* (2013.01); *H01L 31/052* (2013.01);
(Continued)

(58) Field of Classification Search
CPC ............... H01L 31/0547; H01L 31/052; H01L 31/0543; H01L 31/042; H01L 31/18; Y02E 10/52
See application file for complete search history.

(56) References Cited

U.S. PATENT DOCUMENTS 9,190,546 B1 * 11/2015 Anderson ........... H01L 31/0547
2005/0081909 A1 * 4/2005 Paull .................. G02B 19/0028
136/246

(Continued)

FOREIGN PATENT DOCUMENTS

CN    102893416    1/2013
TW    201035505    10/2010
(Continued)

OTHER PUBLICATIONS

International Search Report & Written Opinion, PCT/US2017/018865, dated May 11, 2017.
(Continued)

*Primary Examiner* — Golam Mowla
(74) *Attorney, Agent, or Firm* — Lempia Summerfield Katz LLC

(57) ABSTRACT

The present disclosure relates to compound parabolic concentrators. In one implementation, a compound parabolic concentrator may include a parabolic array having a base, a side wall, and an aperture for receiving light and a dielectric layer having a refractive index. In another implementation, a stacked compound parabolic concentrator may include a parabolic array having a base, a side wall, and an aperture for receiving light and multiple dielectric layers within the
(Continued)

array. Each dielectric layer may have a refractive index, and the refractive index may decrease with each dielectric layer moving from the base of the parabolic array to the light receiving aperture.

32 Claims, 13 Drawing Sheets

(51) Int. Cl.
  *H01L 31/052* (2014.01)
  *H01L 31/18* (2006.01)
(52) U.S. Cl.
  CPC .......... *H01L 31/0543* (2014.12); *H01L 31/18* (2013.01); *Y02E 10/52* (2013.01)

(56) References Cited

U.S. PATENT DOCUMENTS

| | | | |
|---|---|---|---|
| 2006/0072222 A1* | 4/2006 | Lichy | G02B 19/0042 359/861 |
| 2006/0191566 A1* | 8/2006 | Schaafsma | H01L 31/0547 136/246 |
| 2009/0014056 A1* | 1/2009 | Hockaday | H01L 31/035281 136/246 |
| 2010/0269886 A1 | 10/2010 | Argentar | |
| 2014/0083482 A1 | 3/2014 | Hebrink | |
| 2014/0376218 A1* | 12/2014 | Ni | F21V 29/89 362/217.14 |

FOREIGN PATENT DOCUMENTS

| | | |
|---|---|---|
| WO | 2013029087 A1 | 3/2013 |
| WO | WO 2013/029087 A1 | 3/2013 |
| WO | 2015154080 A1 | 10/2015 |
| WO | WO 2015/154080 A1 | 10/2015 |

OTHER PUBLICATIONS

Office Action in Taiwan Patent Application No. 106106007, dated Sep. 25, 2020, 20 pages (including English translation).
Office Action in Taiwan Patent Application No. 106106007, dated Sep. 25, 2020, 18 pages (including machine translation).
Search Report in Taiwan Patent Application No. 106106007, dated Sep. 15, 2020, 4 pages (including English translation).

\* cited by examiner

STACKED COMPOUND PARABOLIC CONCENTRATORS INTEGRATED WITH MULTIPLE DIELECTRIC LAYERS FOR WIDE ACCEPTANCE ANGLE

CROSS-REFERENCE TO RELATED APPLICATION

This application claims the benefit of priority to U.S. Provisional Patent Application No. 62/298,162, filed on Feb. 22, 2016, which is incorporated by reference herein in its entirety.

JOINT RESEARCH AGREEMENT

The subject matter of this application was made by, on behalf of, and/or in connection with one or more of the following parties to a joint university-corporation research agreement: The Regents of the University of Michigan and NanoFlex Power Corporation. The agreement was in effect on and before the date the subject matter of this application was made, and such was made as a result of activities undertaken within the scope of the agreement.

The present disclosure generally relates to solar concentrators. More particularly, and without limitation, the present disclosure relates to compound parabolic concentrators and methods of manufacture thereof.

Many commercial solar cell modules include solar concentrators, which may reduce the overall cost of the module and enhance the performance thereof. Concentrators increase performance by concentrating incoming light to a smaller area, which increases the intensity because intensity is inversely proportional to area. Moreover, by reducing the area of the module, concentrators reduce the amount of solar cell material required, thereby lowering cost.

However, solar concentrators generally have narrow acceptance angles. For example, many commercial solar concentrators have acceptance angles of less than 3°, and many compound parabolic concentrators have acceptance angles between 0.1° and 0.5° because the concentration factor is inversely proportional to the square of the sine of the acceptance angle. Outside of these narrow acceptance angles, solar concentrators suffer from poor collection efficiency.

One solution is to adjust the position of the concentrator in order to maximize the time during which light enters the concentrator within the acceptance angle. However, these adjustments, whether performed over the course of the day (to follow the sun's longitudinal movement along the sun path) or the course of the year (to follow the sun's latitudinal movement along the sun path) or a combination thereof, may require costly computer systems.

Therefore, there is a need for solar concentrators with wide acceptance angles in order to reduce and/or eliminate the need for adjustments due to the sun path.

The CPCs of the present disclosure address this need. Advantageously, this may combine the concentration factors available with CPCs, e.g., often between 4 and 10, with an increased acceptance angle. Such CPCs have many uses, including, for example, in low-cost flat panel photovoltaics without position adjustment; in low-profile, large area solar cell modules; etc.

In some embodiments, the disclosed CPCs may include a single dielectric layer. Advantageously, in one aspect, CPCs as disclosed herein may exhibit an improved concentration factor at angles closest to and furthest from the optical axis.

In other embodiments, the disclosed CPCs may include stacked dielectric layers. Advantageously, in one aspect, stacked CPCs as disclosed herein may exhibit an improved concentration factor at angles between, for example, 20° and 70° from the optical axis.

According to one embodiment of the present disclosure, a compound parabolic concentrator (CPC) comprises a parabolic array having a base, a side wall, and an aperture for receiving light; and a dielectric layer having a refractive index.

Dielectric materials are known in the art and those of ordinary skill will be able to select suitable materials based on the present disclosure. In some embodiments, the dielectric layer may comprise at least one of PMMA or titanium dioxide. In some embodiments, the parabolic array may comprise at least one plastic. For example, the parabolic array may comprise polyethylene terephthalate glycol-modified (PETG). In certain aspects, the parabolic array may have a thickness between 0.5 mm and 0.75 mm.

In some embodiments, the parabolic array may comprise a superposition of two parabolas along a vertical axis. In some embodiments, the parabolic array may further comprise a superposition of two parabolas along a horizontal axis.

In some embodiments, the base of the parabolic array may have a large area, such as larger than the area of a photovoltaic or array or photovoltaics. In certain embodiments, the base may have an area of 10,000 mm$^2$ or greater. The base of the array may have a desired shape, such as a rectangular shape or square shape. The CPC may have a low profile (for example, the side wall may have a height no greater than one-half of a length of the base). The CPC may also include a reflective film on the base and/or side wall. In some embodiments, the reflective film comprises at least one of silver and aluminum. In certain aspects, the reflective film may have a thickness of at least 500 nm.

The CPC may further include a photovoltaic. In some embodiments, the photovoltaic may have a large area, e.g., the size of a small roof, or approximately 275 m$^2$. In other embodiments, the photovoltaic may have a small area, e.g., between 1 and 5 mm$^2$. In still other embodiments, the photovoltaic may have an area, e.g., approximately 3600 mm$^2$. The photovoltaic may be formed as a square, a rectangle, or any other appropriate shape for integration with or attachment to the parabolic base. In some embodiments, the photovoltaic may have an area smaller than the area of the base of the array. For example, the photovoltaic may have an area no greater than two-thirds of the area of the base. In certain aspects, the photovoltaic may be attached to the base using one or more adhesives. In certain aspects, the photovoltaic may be at least partially integrated on the base. For example, the photovoltaic may be transfer-printed onto the base of the array.

The CPC may further include a diffuser. In certain aspects, the diffuser may be disposed on the portion of the base of the parabolic array not including the photovoltaic. In certain aspects, the diffuser may exhibit Lambertian reflectance. In other aspects, the diffuser may exhibit approximate Lambertian reflectance. In some embodiments, the diffuser of the CPC may comprise ground glass, nanoparticle arrays, microlens arrays, or the like.

According to another embodiment of the present disclosure, a stacked compound parabolic concentrator (CPC) comprises a parabolic array having a base, a side wall, and an aperture for receiving light; and multiple dielectric layers within the array, each dielectric layer having a refractive index, wherein the refractive index decreases with each dielectric layer moving from the base of the parabolic array to the light receiving aperture. For example, in some embodiments, the stacked CPC may include a first dielectric layer and a second dielectric layer over the first dielectric layer, and the refractive index of the first dielectric layer may be greater than the refractive index of the second dielectric layer. In other embodiments, the stacked CPC may include at least three, four, five, six, seven, or eight dielectric layers within the parabolic array, and the refractive index may decrease with each dielectric layer moving from the base of the parabolic array to the light receiving aperture.

Dielectric materials are known in the art and those of ordinary skill will be able to select suitable materials based on the present disclosure. In some embodiments, at least one dielectric layer may comprise PMMA. In some embodiments, at least one dielectric layer may comprise titanium dioxide.

In some embodiments, the parabolic array may comprise at least one plastic. For example, the parabolic array may comprise polyethylene terephthalate glycol-modified (PETG). In certain aspects, the parabolic array may have a thickness between 0.5 mm and 0.75 mm.

In some embodiments, the parabolic array may comprise a superposition of two parabolas along a vertical axis. In some embodiments, the parabolic array may further comprise a superposition of two parabolas along a horizontal axis. In certain aspects, the horizontal axis may be located between dielectric layers. In other aspects, the horizontal axis may be otherwise located.

In some embodiments, the base of the parabolic array may have a large area, such as larger than the area of a photovoltaic or array of photovoltaics. In certain embodiments, the base may have an area of 10,000 $mm^2$ or greater. The base of the array may have a desired shape, such as a rectangular shape or square shape. The CPC may have a low profile (for example, the side wall may have a height no greater than one-half of a length of the base). The CPC may also include a reflective film on the base and/or side wall. In some embodiments, the reflective film comprises at least one of silver and aluminum. In certain aspects, the reflective film may have a thickness of at least 500 nm.

The stacked CPC may further include a photovoltaic. In some embodiments, the photovoltaic may have a large area, the size of a small roof, or approximately 275 $m^2$. In other embodiments, the photovoltaic may have a small area, e.g., between 1 and 5 $mm^2$. In still other embodiments, the photovoltaic may have an area, e.g., approximately 3600 $mm^2$. The photovoltaic may be formed as a square, a rectangle, or any other appropriate shape for integration with or attachment to the parabolic base. In some embodiments, the photovoltaic may have an area smaller than the area of the base of the array. For example, the photovoltaic may have an area no greater than two-thirds of the area of the base. In certain aspects, the photovoltaic may be attached to the base using one or more adhesives. In certain aspects, the photovoltaic may be at least partially integrated on the base. For example, the photovoltaic may be transfer-printed onto the base of the array.

The stacked CPC may further include a diffuser. In certain aspects, the diffuser may be disposed on the portion of the base of the parabolic array not including the photovoltaic. In certain aspects, the diffuser may exhibit Lambertian reflectance. In other aspects, the diffuser may exhibit approximate Lambertian reflectance. In some embodiments, the diffuser of the stacked CPC may comprise ground glass, nanoparticle arrays, microlens arrays, or the like.

In a further aspect, a method of manufacturing a compound parabolic concentrator having a desired shape comprises applying heat and vacuum to a thermoplastic and a metal vacuum mold having the desired shape; cooling the thermoplastic, such as to room temperature, to form a parabolic array having a base and a side wall and the desired shape; depositing a reflecting film on the thermoplastic surface; and depositing multiple dielectric layers within the parabolic array over the reflecting film.

In some embodiments, applying heat and vacuum may include placing the thermoplastic and metal mold into a heating apparatus having a first temperature; applying the vacuum through holes included on the base of the metal mold; and raising the temperature of the heating apparatus to a second temperature. In certain aspects, the second temperature may be higher than the first temperature.

In some embodiments, the method may further include fixing the thermoplastic to the metal mold before heat and vacuum is applied. In yet another embodiment, the method may include detaching the thermoplastic from the metal mold after cooling, such as cooling to room temperature. In still another embodiment, the method may include transferring a photovoltaic onto the base of the thermoplastic after cooling, such as cooling to room temperature.

In some embodiments, the method may further include depositing the reflecting film using at least one of vacuum thermal deposition, e-beam deposition, or sputtering. In certain aspects, the reflecting film may include at least one of aluminum or silver. In certain aspects, the reflecting film may have a thickness of at least 500 nm.

In some embodiments, the method may further include filling the dielectric layers using a sol-gel process.

BRIEF DESCRIPTION OF FIGURES

FIG. 10A shows an example of ray traces for an exemplary stacked CPC. FIG. 10B shows a second example of ray traces for the exemplary stacked CPC of FIG. 10A. The examples are derived from computer simulations using the TracePro ray tracing tool.

FIG. 11A shows an example of ray traces for an exemplary stacked CPC having a side wall comprising a superposition of two parabolas along a horizontal axis. FIG. 11B shows an example of ray traces for an exemplary stacked CPC of FIG. 11A. The examples are derived from computer simulations using the TracePro ray tracing tool.

DETAILED DESCRIPTION

As used herein, the singular forms "a," "an," and "the" include plural reference unless the context clearly dictates otherwise.

As used herein, the term "layer" refers to a member or component of a photosensitive device whose primary dimension is X-Y, i.e., along its length and width, and is typically perpendicular to the plane of incidence of the illumination. It should be understood that the term "layer" is not necessarily limited to single layers or sheets of materials. A layer may comprise laminates or combinations of several sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) and/or material(s).

As used herein, the expression "disposed on," "located over," "deposited over" and the like permits other materials or layers to exist between a material being disposed and the material on or over which it is disposed. Likewise, the expression "bonded to" permits other materials or layers to exist between a material being bonded and the material to which it is bonded.

Figure 1:
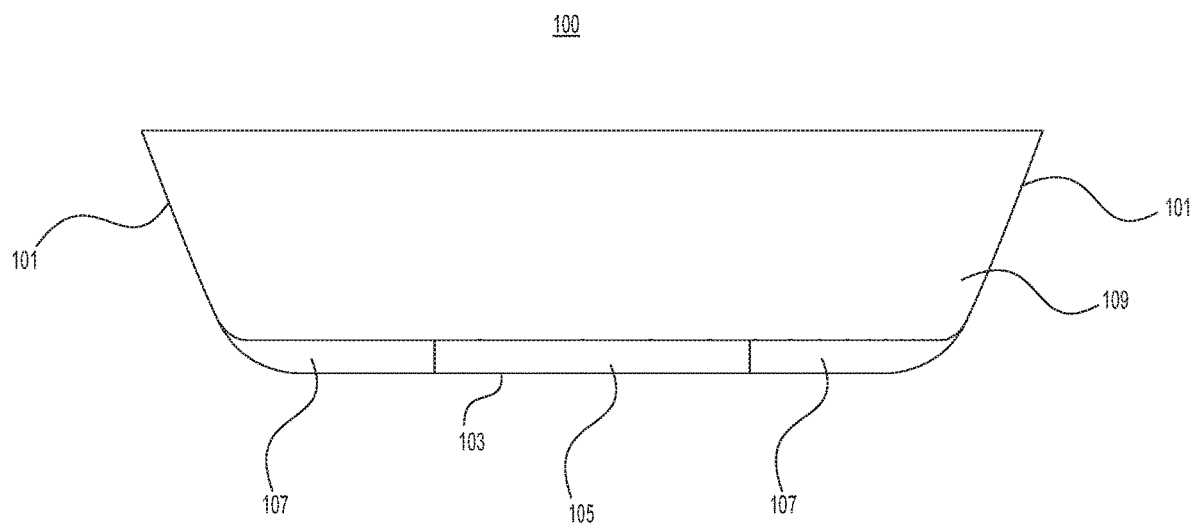
FIG. 1. An exemplary compound parabolic concentrator (CPC), according to embodiments of the present disclosure, is shown.

In one aspect of the present disclosure, a compound parabolic concentrator (CPC) is disclosed (FIG. 1). A compound parabolic concentrator is used to collect and concentrate light, such as for solar electricity generation.

As depicted in FIG. 1, the CPC 100 may include a parabolic array having a base 103, a side wall 101, and an aperture to receive light. In some embodiments, the parabolic array may comprise at least one plastic. For example, the parabolic array may comprise polyethylene terephthalate glycol-modified (PETG). In certain aspects, the parabolic array may have a thickness between 0.5 mm and 0.75 mm.

In some embodiments, the parabolic array may comprise a superposition of two parabolas along a vertical axis. In some embodiments, the parabolic array may further comprise a superposition of two parabolas along a horizontal axis.

CPC 100 may further include a photovoltaic 105. Photovoltaic 105 is not limited to any particular type of photovoltaic. For example, photovoltaic 105 may include one or more traditional crystalline silicon (c-Si) solar cells. Traditional c-Si solar cells are generally made of multicrystalline and monocrystalline silicon. In other aspects, photovoltaic 105 may include one or more thin-film solar cells. For example, thin-film solar cells may include gallium arsenide (GaAs) solar cells, cadmium telluride (CdTe) solar cells, copper indium gallium diselenide (CIGS) solar cells, amorphous thin-film silicon (a-Si, TF-Si) solar cells, etc. By way of additional example, thin-film solar cells may include third-generation technologies like organic solar cells, dye-sensitized solar cells, polymer solar cells, quantum dot solar cells, copper zinc tin sulfide solar cells, nanocrystal solar cells, micromorph solar cells, perovskite solar cells, etc. In other aspects, photovoltaic 105 may include one or more multi-junction solar cells. Multi junctions solar cells generally include gallium arsenide (GaAs) and/or other semiconductor materials. Photovoltaic 105 may also include any combination of traditional crystalline silicon solar cells, thin-film solar cells, and/or multi-function solar cells.

In certain aspects, photovoltaic 105 may have a large area, e.g., the size of a small roof, or approximately 275 m$^2$. In other aspects, photovoltaic 105 may have a small area, e.g., between 1 and 5 mm$^2$. In other aspects, photovoltaic may have an area, e.g., approximately 3600 mm$^2$. Of course, other aspects with photovoltaics of varying area are possible. In certain aspects, photovoltaic 105 may comprise a symmetrical shape, but other embodiments including irregular shapes are possible. In certain aspects, photovoltaic 105 may comprise a parallelogram, a rhombus, a rectangle, a square, or the like.

Base 103 may have a large area, such as larger than a photovoltaic or array of photovoltaics. In certain embodiments, the base has an area e.g., approximately 10,000 mm$^2$. In some embodiments, base 103 has an area larger than that of photovoltaic 105, e.g., approximately 1.5 times larger. Of course, other embodiments with bases of varying area are possible. Similarly, the ratio of the area of base 103 to photovoltaic 105 may also be varied significantly.

In certain aspects, side wall 101 may have a low profile, e.g., with an aspect ratio of less than 2:1. For example, if base 103 has at least one length of 100 mm, side wall 101 may have a height of less than 50 mm, e.g., 30 mm. Of course, the height of side wall 101 of CPC 100 may be varied significantly.

In some embodiments, CPC 100 may be arranged such that photovoltaic 105 is entirely disposed on base 103. In certain aspects, photovoltaic 105 may be centered on base 103 or, if base 103 comprises an irregular shape, may be approximately centered on base 103.

Compound parabolic concentrator (CPC) 100 may further include a diffuser 107 disposed on base 103. As depicted in FIG. 1, diffuser 107 may be disposed on the portion of base 103 that does not include photovoltaic 105. In certain aspects, diffuser 107 may exhibit Lambertian reflectance. In other aspects, diffuser 107 may exhibit approximate Lambertian reflectance. For example, diffuser 107 may comprise ground glass, nanoparticle arrays, microlens arrays, or the like.

The geometry of CPC 100 may be adapted to maximize internal total reflectance within the concentrator. For example, base 103 and side wall 101 of CPC 100 may be adjusted to randomize the reflection from diffuser 107. Advantageously, this may reduce the amount of light diffuser 107 reflects directly back into the air.

Compound parabolic concentrator (CPC) 100 may further include a reflecting film (not shown) deposited on at least one of base 103 or side wall 101. In some embodiments, the reflecting film may comprise at least one of aluminum or silver. In certain aspects, the reflecting film may have a thickness of at least 500 nm. In some embodiments, the reflecting film may be integrated with at least one of base 103 or side wall 101.

Compound parabolic concentrator (CPC) 100 may further include dielectric layer 109. In some embodiments, dielectric layer 109 may have a refractive index between 1.3 and 1.5. For example, dielectric layer 109 may comprise poly (methyl methacrylate) (PMMA). In other embodiments, dielectric layer 109 may have a refractive index between 2.3 and 2.5. For example, dielectric layer 109 may comprise titanium dioxide.

Figure 2:
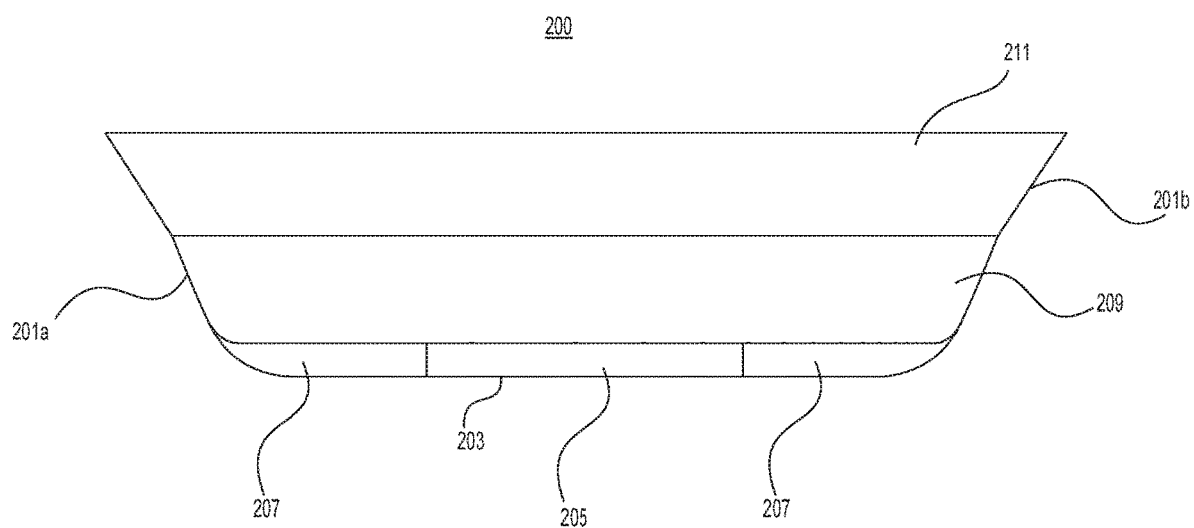
FIG. 2. An exemplary stacked compound parabolic concentrator (CPC) with two dielectric layers, according to embodiments of the present disclosure, is shown.
Figure 3:
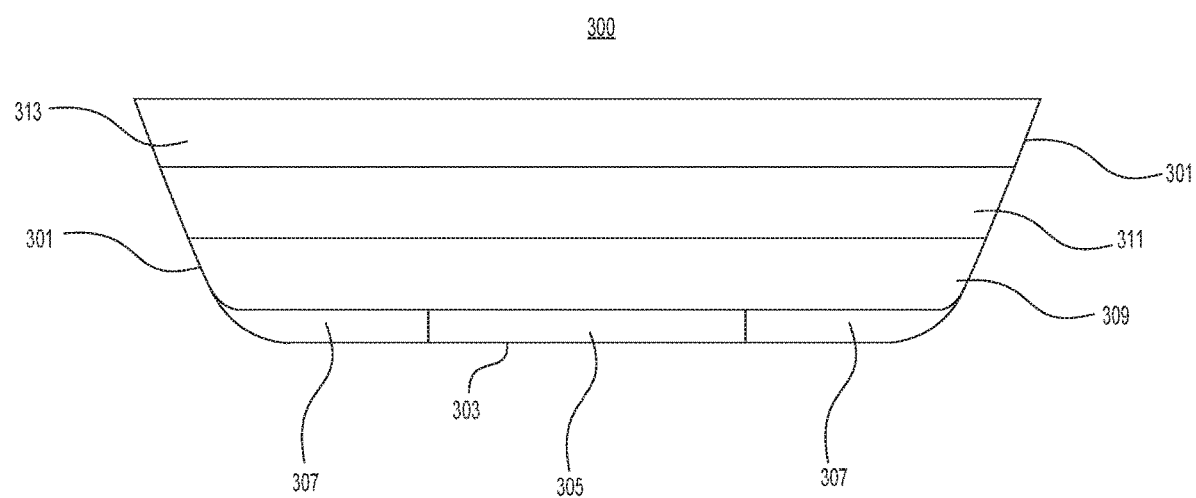
FIG. 3. An exemplary stacked compound parabolic concentrator (CPC) with three dielectric layers, according to embodiments of the present disclosure, is shown.
Figure 4:
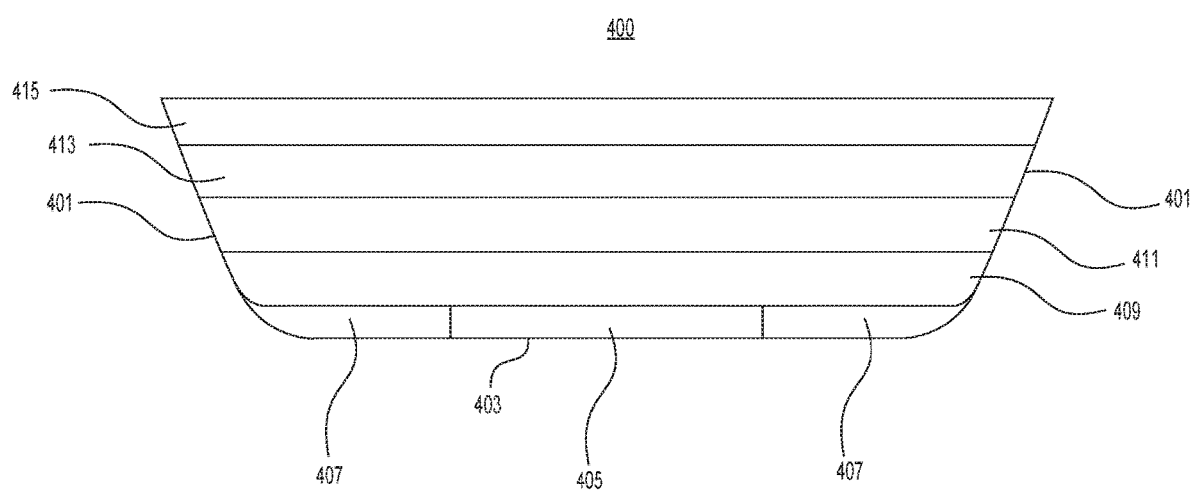
FIG. 4. An exemplary stacked compound parabolic concentrator (CPC) with four dielectric layers, according to embodiments of the present disclosure, is shown.

Another aspect of the present disclosure is directed to a stacked compound parabolic concentrator (CPC) (FIGS. 2, 3, and 4). Even though FIGS. 2, 3, and 4 depict stacked CPCs having two, three, and four dielectric layers, respectively, additional embodiments including five, six, seven, or eight layers are also possible. Although a compound parabolic concentrator is generally used in solar electricity generation, additional uses of the disclosed embodiments are possible.

As depicted in FIG. 2, stacked CPC 200 may include a parabolic array having a base 103 and a side wall 101. Similar to CPC 100, stacked CPC 200 may include a base 203, a side wall 201, an aperture to receive light, a photovoltaic 205, and a diffuser 207.

Stacked compound parabolic concentrator (CPC) 200 may further include a first dielectric layer 209 and a second dielectric layer 211. In some embodiments, first dielectric layer 209 may have a refractive index between 2.3 and 2.5. For example, first dielectric layer 209 may comprise titanium dioxide. In some embodiments, second dielectric layer 211 may have a refractive index between 1.3 and 1.5. For example, second dielectric layer 211 may comprise poly(methyl methacrylate) (PMMA).

In some embodiments, the parabolic array may comprise a superposition of two parabolas along a vertical axis. Furthermore, as depicted in FIG. 2, the parabolic array may further comprise a superposition of two parabolas along a horizontal axis. For example, side wall 201 includes a portion 201a comprising a volume of revolution of a first parabola and a portion 201b comprising a volume of revolution of a second parabola. As further depicted in FIG. 2, the horizontal axis may be located between first dielectric layer 209 and second dielectric layer 211 within the array. In other embodiments, the horizontal axis may be otherwise located.

As depicted in FIG. 3, stacked CPC 300 may include a parabolic array having a base 303 and a side wall 301. Similar to CPC 100, stacked CPC 300 may include a base 303, a side wall 301, an aperture to receive light, a photovoltaic 305, and a diffuser 307.

Stacked compound parabolic concentrator (CPC) 300 may further include a first dielectric layer 309, a second dielectric layer 311, and a third dielectric layer 313. In some embodiments, first dielectric layer 309 may have a refractive index greater than the refractive index of second dielectric layer 311, and second dielectric layer 311 may have a refractive index greater than the refractive index of third dielectric layer 313.

In some embodiments, the parabolic array may comprise a superposition of two parabolas along a vertical axis. In some embodiments, the parabolic array may further comprise a superposition of two parabolas along a horizontal axis, just as depicted in FIG. 2. In certain aspects, the horizontal axis may be located between dielectric layers, for example, between first dielectric layer 309 and second dielectric layer 311 or between second dielectric layer 311 and third dielectric layer 313. In other embodiments, the horizontal axis may be otherwise located.

As depicted in FIG. 4, stacked CPC 400 may include a parabolic array having a base 403 and a side wall 401. Similar to CPC 100, stacked CPC 400 may include a base 403, a side wall 401, an aperture to receive light, a photovoltaic 405, and a diffuser 407.

Stacked compound parabolic concentrator (CPC) 400 may further include a first dielectric layer 409, a second dielectric layer 411, a third dielectric layer 413, and a fourth dielectric layer 415. In some embodiments, first dielectric layer 409 may have a refractive index greater than the refractive index of second dielectric layer 411, second dielectric layer 411 may have a refractive index greater than the refractive index of third dielectric layer 413, and third dielectric layer 413 may have a refractive index greater than the refractive index of fourth dielectric layer 415.

In some embodiments, the parabolic array may comprise a superposition of two parabolas along a vertical axis. In some embodiments, the parabolic array may further comprise a superposition of two parabolas along a horizontal axis, just as depicted in FIG. 2. In certain aspects, the horizontal axis may be located between dielectric layers, for example, between first dielectric layer 409 and second dielectric layer 411, between second dielectric layer 411 and third dielectric layer 413, or between third dielectric layer 413 and forth dielectric layer 415. In other embodiments, the horizontal axis may be otherwise located.

Figure 5:
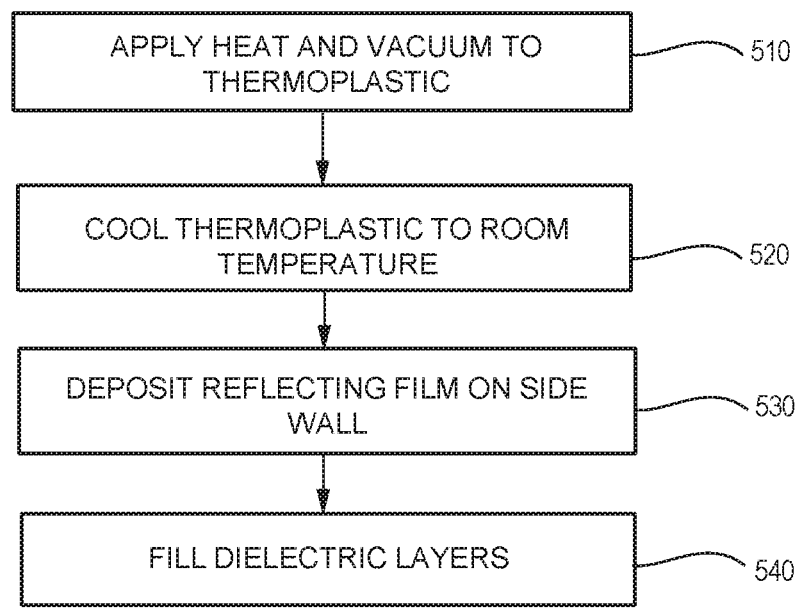
FIG. 5. A flowchart depicting an exemplary method of manufacturing a CPC, according to embodiments of the present disclosure, is shown.

Another aspect of the present disclosure is directed to a method of manufacturing a compound parabolic concentrator (CPC) having a desired shape (FIG. 5). The method 500 may include step 510, applying heat and vacuum to a thermoplastic and a mold having the desired shape. In certain aspects, the mold may include one or more metals.

In certain aspects, the thermoplastic may have a low glass transition temperature, e.g., between 80° C. and 100° C. For example, the thermoplastic may include polyethylene terephthalate glycol-modified (PETG). In certain aspects, the thermoplastic may comprise a thin sheet, e.g., a sheet having a thickness between 0.5 mm and 0.75 mm.

In certain aspects, the mold may include holes at its base to permit the vacuum to be applied. Additionally, in some embodiments, the thermoplastic may be fixed to the mold using poly(4,4'-oxydiphenylene-pyromellitimide). For example, Kapton tape is a commercially available tape including poly(4,4'-oxydiphenylene-pyromellitimide).

Figure 6:
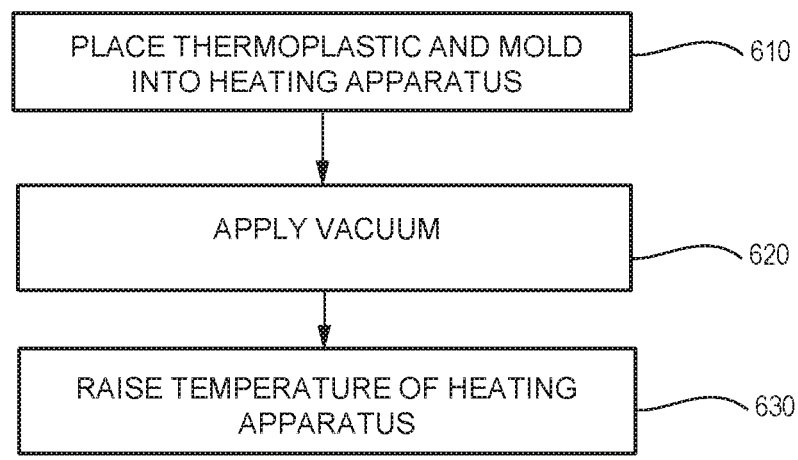
FIG. 6. A flowchart depicting an exemplary method of applying heat and vacuum to a thermoplastic, according to embodiments of the present disclosure, is shown.

In certain aspects, the thermoplastic may be fixed to the mold, e.g., using Kapton tape as described above, before heat and vacuum is applied. Moreover, as depicted in FIG. 6, applying heat and vacuum may comprise method 600. Method 600 may include, for example, step 610, placing the thermoplastic and metal mold into an oven (or other appropriate heating apparatus). In certain aspects, method 600 may include step 620, applying vacuum to the thermoplastic and mold in the oven. Method 600 may further include step 630, raising the temperature of the oven (or other appropriate heating apparatus) to between 95° C. and 98° C. for approximately 15 to 20 minutes.

Returning to FIG. 5, method 500 may further include step 520, cooling the thermoplastic, such as cooling to room temperature, to form a parabolic array having a base and a side wall and the desired shape. In certain aspects, the thermoplastic may be detached from the mold after cooling.

In certain aspects, a photovoltaic may be transferred onto the base of the thermoformed CPC after cooling, such as cooling to room temperature. In certain aspects, the photovoltaic may comprise one or more solar cell strips.

Figure 7:
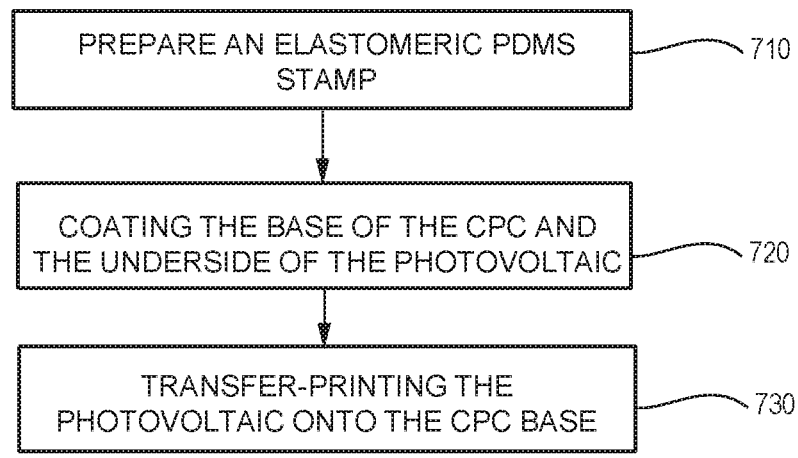
FIG. 7. A flowchart depicting an exemplary method of transferring a photovoltaic to a parabolic array of a CPC, according to embodiments of the present disclosure, is shown.

For example, as depicted in FIG. 7, transferring the photovoltaic may comprise method 700. Method 700 may include, for example, step 710, preparing an elastomeric PDMS stamp. In certain aspects, the PDMS stamp may be prepared using an acrylonitrile butadiene styrene plastic mold. For example, the plastic mold may be shaped using a 3D printer.

Method 700 may further include step 720, coating the base of the CPC and the underside of the photovoltaic with Pd/Au. For example, the coating may comprise depositing Pd/Au (e.g., at 5 nm/100 nm) through a shadow mask using electron evaporation. In some embodiments, method 700 may further include step 730, transfer-printing the photovoltaic onto the base of the CPC using the PDMS stamp. For example, the transfer-printing may comprise adhesive-free low-pressure cold-weld bonding.

In some embodiments, method 700 may further include aligning the photovoltaic to the CPC. For example, the photovoltaic may be aligned using a pyramid-shaped fixture. In certain aspects, no contact is made with the side walls of the CPC during the alignment.

Figure 8:
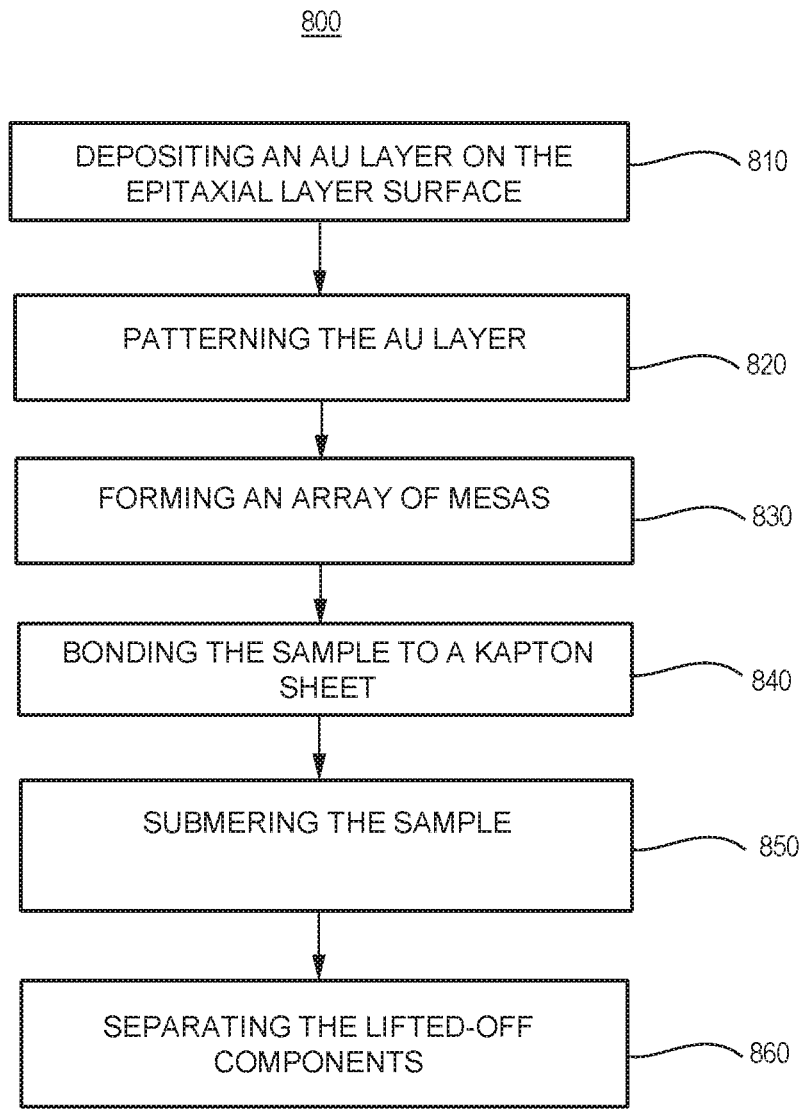
FIG. 8. A flowchart depicting an exemplary method of manufacturing a photovoltaic for a CPC, according to embodiments of the present disclosure, is shown.

By way of further example, the photovoltaic may be formed using a combination of rapid non-destructive epitaxial lift-off (ND-ELO) and cold-weld bonding, as depicted in method 800 of FIG. 8. Advantageously, the use of ND-ELO permits selective remove of the protective layers used in traditional epitaxial lift-off, thereby permitting for the nearly indefinite reuse of the substrates (e.g., GaAs substrates) used in the epitaxial lift-off. This may lower the overall cost of photovoltaic manufacture by converting the cost of the substrates from a material expense to a capital investment.

Method 800 may include step 810, depositing an Au layer on the epitaxial layer surface. In certain aspects, the Au layer may have a thickness of at least 350 nm. Method 800 may further include step 820, patterning the Au layer to form a mask. For example, the patterning may include using photolithography.

In certain aspects, method 800 may further include step 830, forming an array of mesas separated by trenches using wet chemical etching. For example, the trenches may each have a width of at least 500 mm. Advantageously, the etching may terminate at the interface between the active epitaxy and sacrificial layer.

As depicted in FIG. 8, method 800 may further include step 840, bonding the sample to a Kapton sheet. For example, the bonding may include cold-weld bonding. In certain aspects, the Kapton sheet may be a thick (e.g., at least 25 mm thick) E-type Kapton sheet. In certain aspects, the Kapton sheet may be coated with a Cr/Au coating. For example, the Cr/Au coating may comprise a coating mixture of 4 nm/350 nm. In certain aspects, the patterned Au on the wafer is used for the bonding interface.

Method 800 may further include step 850, submerging the sample in dilute, hot HF. In certain aspects, the dilution lasts approximately 30 minutes. In certain aspects, method 800 may further include step 860, separating the lifted-off components along the trenches. For example, separating the components may include using a $CO_2$ laser scriber. In certain aspects, the laser scribe may have a kerf of at least 300 mm.

Returning to FIG. 5, method 500 may further include step 530, depositing a reflecting film on the base and/or side wall. For example, the reflecting film may comprise at least one of silver or aluminum. In certain aspects, the reflecting film may have a thickness of 500 nm or more. In certain aspects, depositing a reflecting film may comprise at least one of vacuum thermal depositing a reflecting film, e-beam depositing a reflecting film, or sputtering a reflecting film. In certain aspects, step 530 may further include screening the photovoltaic using a shadow mask while depositing the reflecting film.

In some embodiments, however, the reflecting film may be integrated with the parabolic array and thus step 530 may be omitted from method 500. In such embodiments, the reflecting film deforms with the thermoplastic when heat and vacuum are applied.

Method 500 may further include step 540, filling the dielectric layers within the array. In certain aspects, filling the dielectric layers may comprise using the sol-gel process.

Exemplary techniques are disclosed in K. Lee, J. Lee, B. A. Mazor, and S. R. Forrest, "Transforming the cost of solar-to-electrical energy conversion: Integrating thin-film GaAs solar cells with non-tracking mini-concentrators," *Light Sci. Appl.*, vol. 4, no. 5, p. e288, May 2015, which is incorporated herein by reference. Examples of the sol-gel process are incorporated by reference from A. E. Comyns, *Sol-gel Technology for Thin Films, Fibers, Preforms, Electronics, and Specialty Shapes*, ISBN 0-8155-1154-X.

Any materials and layers in the embodiments disclosed above may be deposited in accordance with any techniques known in the art.

EXAMPLES

The present disclosure will now be described in greater detail by the following non-limiting examples. It is understood that the skilled artisan will envision additional embodiments consistent with the disclosure provided herein.

To demonstrate the effectiveness of the compound parabolic concentrators, the following exemplary experiments were performed using computer simulations. As a demonstration of the effectiveness of said concentrators, incoming rays were traced using the TracePro ray tracing tool and concentration factors were computed.

The simulation was set up as follows. The photovoltaic was designed as a square with sides of length 62.5 mm (and thus with an area of 3906.25 $mm^2$), and the concentrator was designed such that its base length was 100 mm and its height 30 mm. The photovoltaic comprised an array of gallium arsenide (GaAs) solar cells. The base of the concentrator was designed with a diffuser disposed on the area of the base not including the photovoltaic. The diffuser was assumed to be a Lambertian reflector.

The lower dielectric layer comprised titanium dioxide (thus having a refractive index of 2.38) and had a height of 15 mm. The upper dielectric layer comprised poly(methyl methacrylate) (PMMA) (thus having a refractive index of 1.49) and had a height of 15 mm. The side wall of the concentrator was assumed to be a perfect reflector. The square concentrator was assumed to have an optical efficiency of approximately 90%. In other embodiments where the concentrator has a different shape, the efficiency may be higher or lower.

The simulations assumed the concentrator was illuminated by a collimated blackbody radiation source illuminated with temperature of the sun. The photovoltaic cell was assumed to be a perfect absorber.

Figure 9:
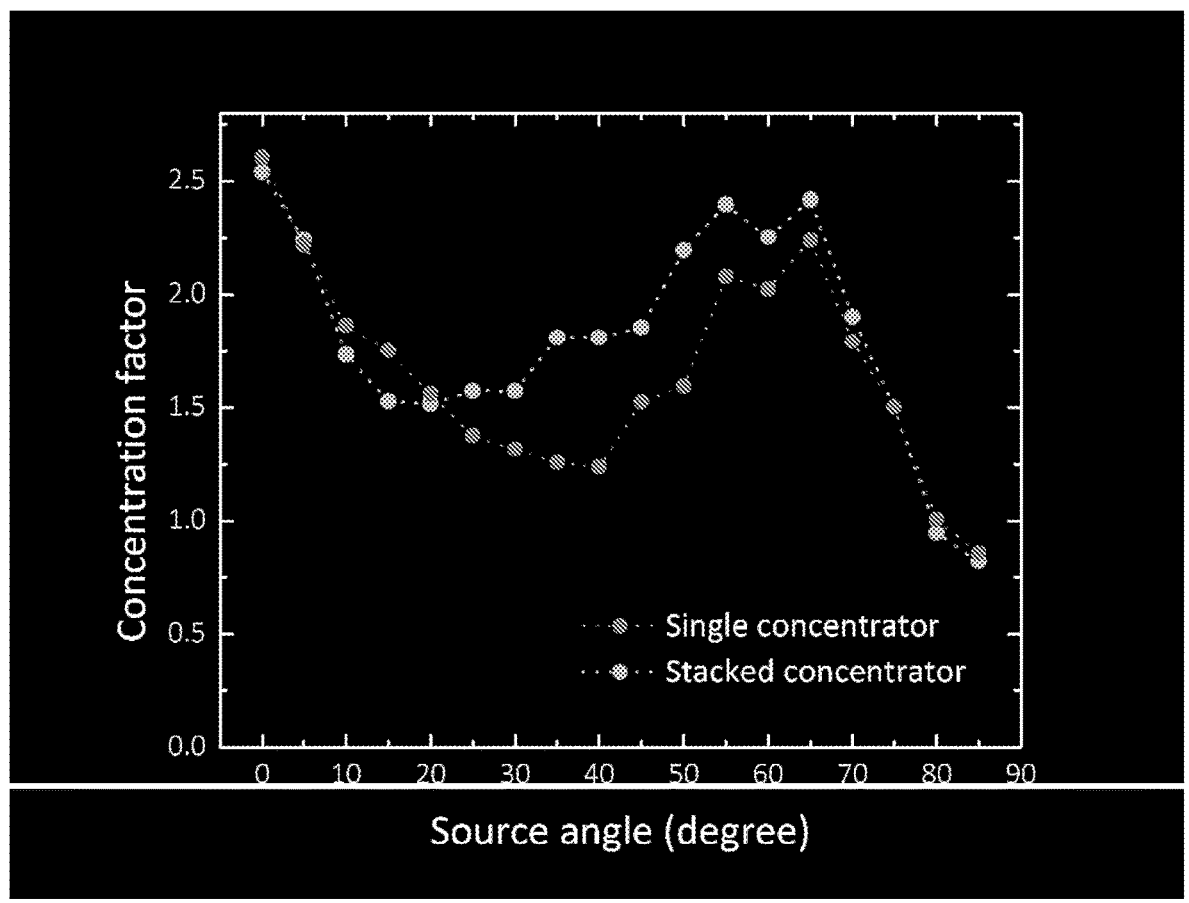
FIG. 9. An example of concentration factors for the exemplary CPC and stacked CPC of FIGS. 1 and 2 is shown. The examples are derived from computer simulations.

FIG. 9 shows the concentration factors for the CPC and the stacked CPC based on the simulations. As may be seen, both concentrators may exhibit concentration of at least 1 sun over approximately 160°. Such concentration may be significantly higher than most previously-developed concentrators. Moreover, both concentrators may exhibit concentration of approximately 2.5 suns at normal incidence due to the low profile of the CPC, i.e., a height of 30 mm compared to a width of 100 mm.

Figure 10A:
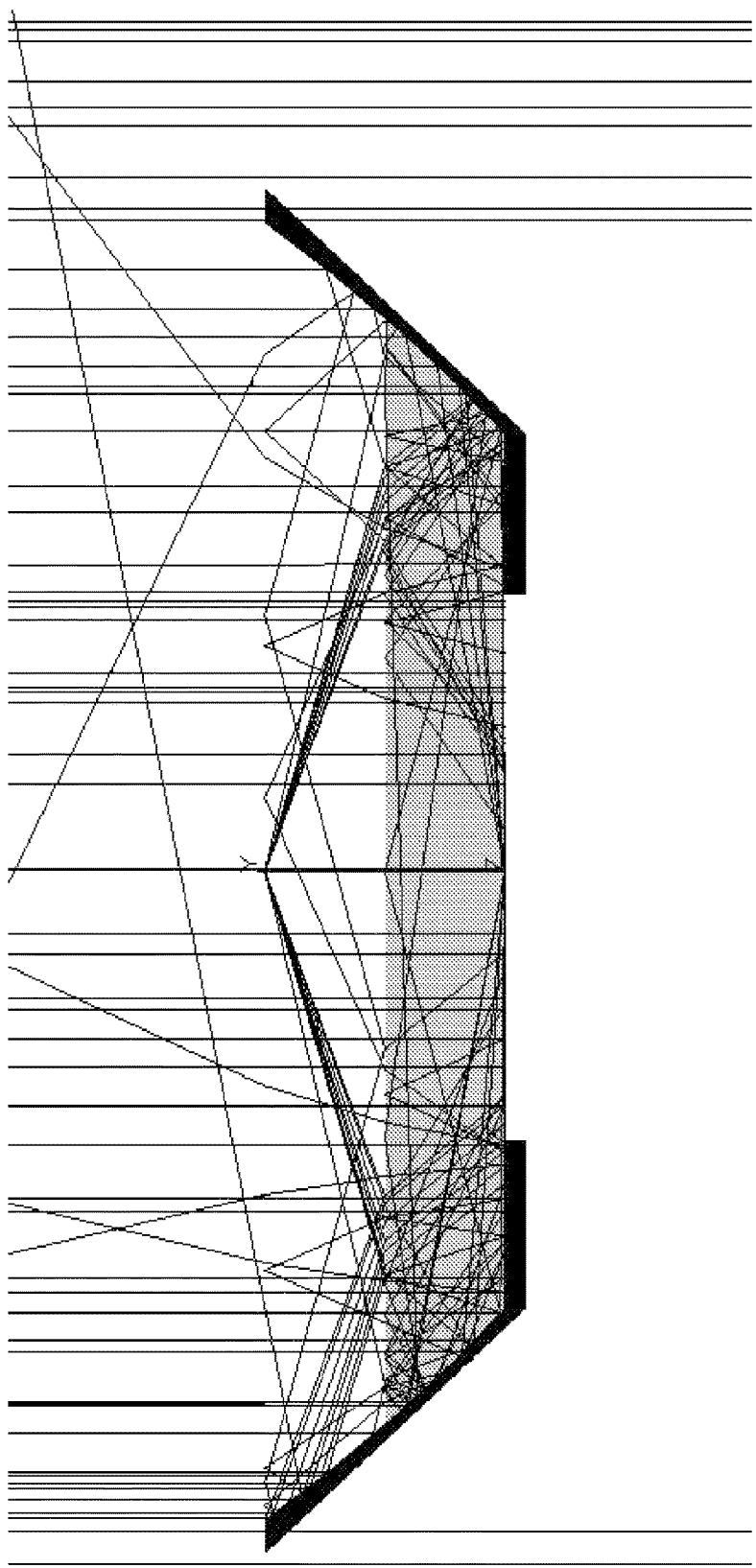
FIGS. 10A and 10B.
Figure 10B:
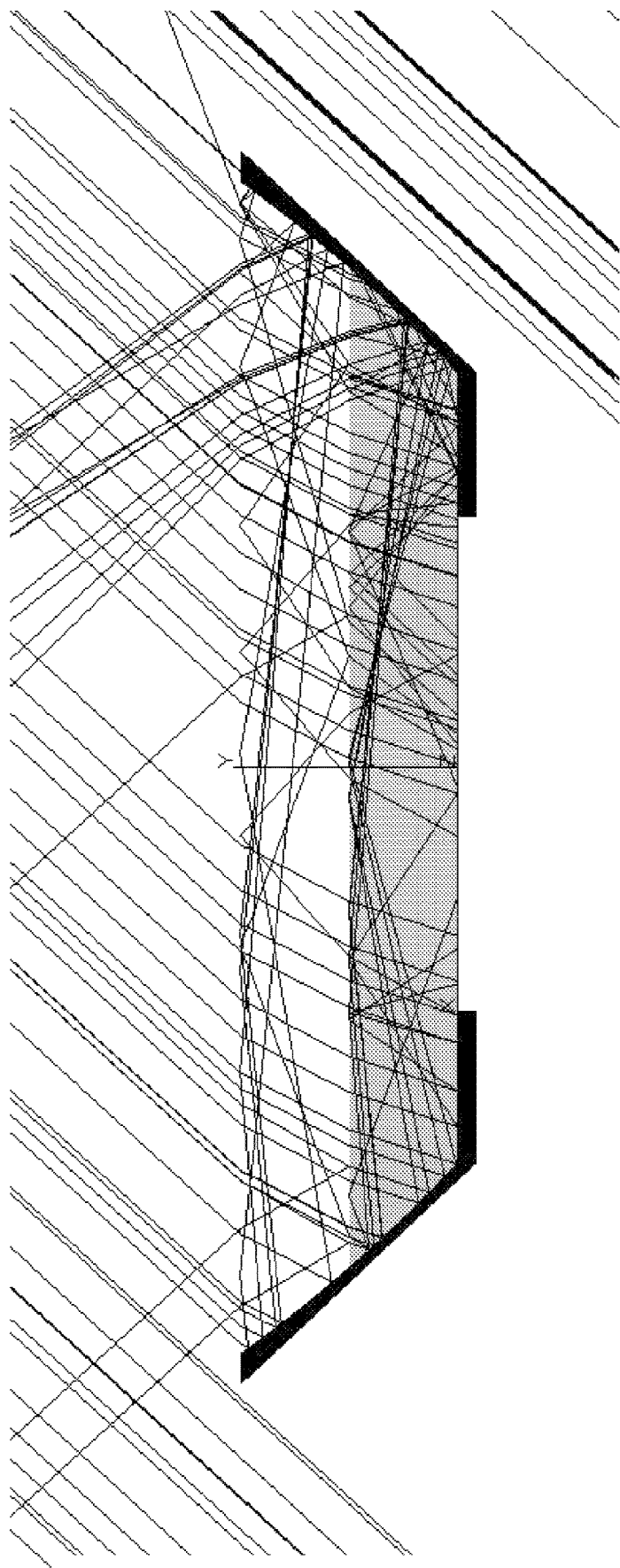

FIG. 10A shows one simulation of rays entering a stacked CPC along the optical axis. As may be seen, light may be trapped in each dielectric layer because of total internal reflection caused by the mismatches of the reflective indices. FIG. 10B shows a second simulation of rays entering the stacked CPC at angles.

Figure 11A:
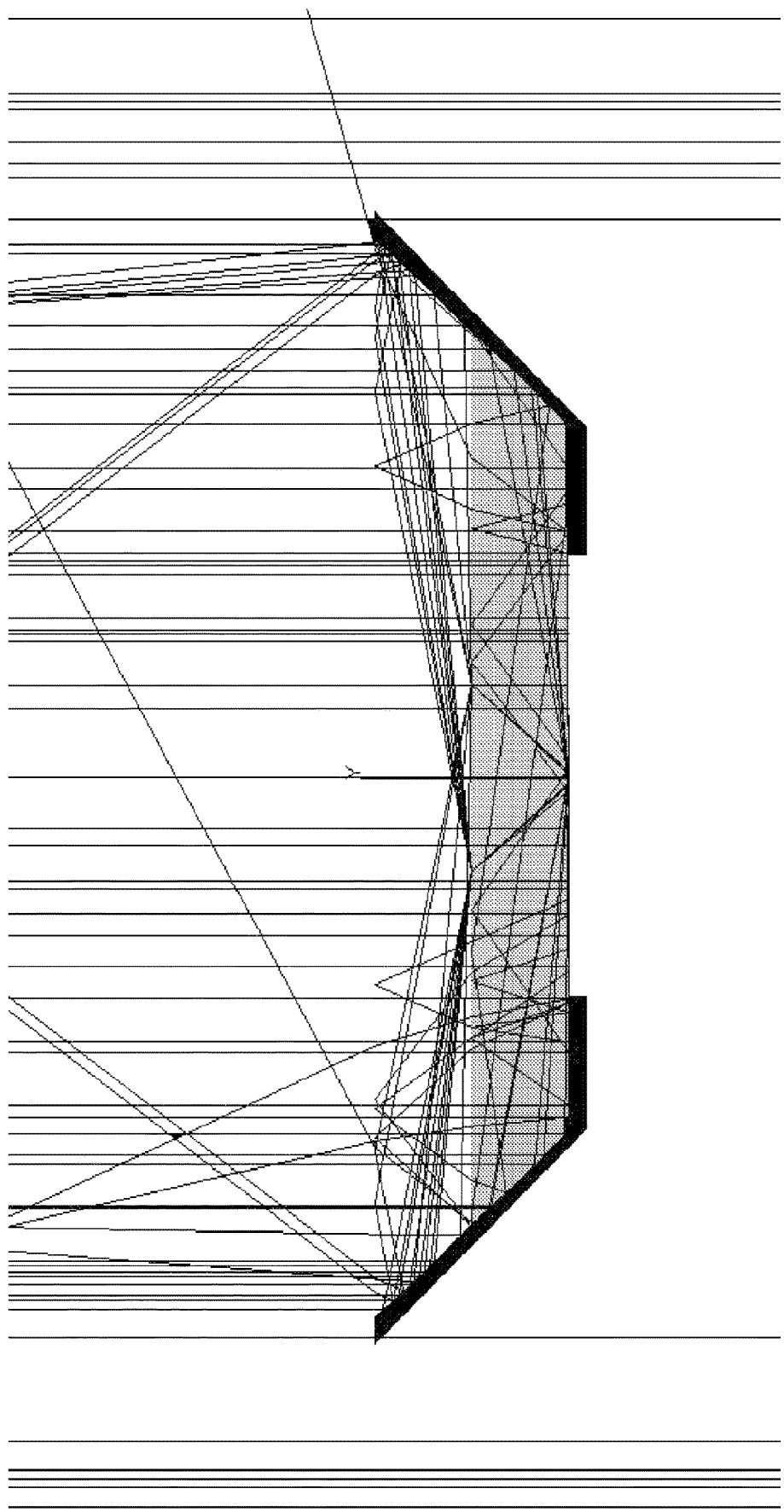
FIGS. 11A and 11B.
Figure 11B:
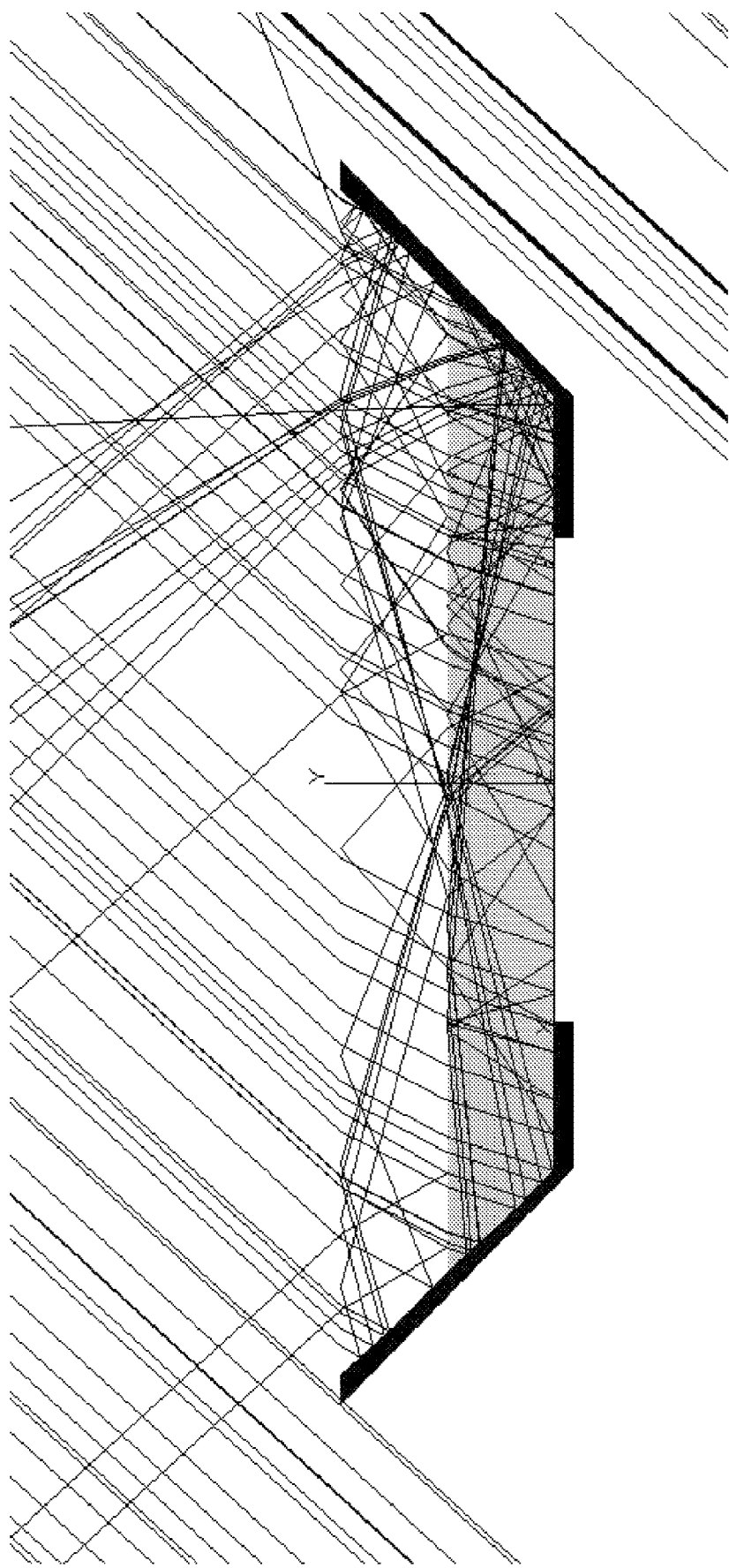

FIG. 11A shows one simulation of rays entering along the optical axis of a stacked CPC having a side wall comprising a superposition of two parabolas along a horizontal axis. FIG. 11B shows a second simulation of rays entering, at angles, the stacked CPC having a side wall comprising a superposition of two parabolas along a horizontal axis. As may be seen, the efficiency of the stacked CPC may be increased when it has a side wall comprising a superposition of two parabolas along a horizontal axis.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments.

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

The features and advantages of the disclosure are apparent from the detailed specification, and thus, it is intended that the appended claims cover all systems and methods falling within the true spirit and scope of the disclosure. As used herein, the articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur to those skilled in the art, it is not desired to limit the disclosure to the exact construction and operation illustrated and described, and accordingly, all suitable modifications and equivalents may be resorted to, falling within the scope of the disclosure.

Other embodiments will be apparent to those skilled in the art from consideration of the specification and practice of the embodiments disclosed herein, it is intended that the specification and examples be considered as exemplary only, with a true scope and spirit of the disclosed embodiments being indicated by the following claims.

What is claimed:

1. A compound parabolic concentrator, comprising:
   a parabolic array having a base, a side wall, and an aperture for receiving light;
   a dielectric layer having a refractive index, the dielectric layer being disposed within the parabolic array;
   a diffuser disposed between the base and the dielectric layer;
   a photovoltaic device, wherein the photovoltaic is located on the base of the parabolic array, and
   wherein the diffuser is disposed on a portion of the base of the parabolic array not including the photovoltaic device.

2. The concentrator of claim 1, wherein the parabolic array comprises at least one plastic.

3. The concentrator of claim 1, wherein the parabolic array comprises a superposition of two parabolas along a vertical axis.

4. The concentrator of claim 1, wherein the parabolic array comprises a superposition of two parabolas along a vertical axis combined with a superposition of two parabolas along a horizontal axis.

5. The concentrator of claim 1, wherein the base has a rectangular or square shape.

6. The concentrator of claim 1, wherein the side wall has a height no greater than one-half of at least one length of the base.

7. The concentrator of claim 1, wherein the dielectric layer comprises at least one of PMMA or titanium dioxide.

8. The concentrator of claim 1,
   wherein the photovoltaic device has an area smaller than the area of the base.

9. The concentrator of claim 8, wherein the photovoltaic device comprises an array of GaAs solar cells.

10. The concentrator of claim 8, wherein the photovoltaic device has an area no more than two-thirds of the area of the base.

11. The concentrator of claim 8, wherein the diffuser comprises at least one of ground glass, nanoparticle arrays, or microlens arrays.

12. The concentrator of claim 1, further comprising:
    a reflecting film,
    wherein the reflecting film is disposed on at least one of the side wall and the base.

13. The concentrator of claim 12, wherein the reflecting film comprises at least one of silver or aluminum.

14. The concentrator of claim 12, wherein the reflecting film is integrated with at least one of the side wall or the base.

15. A stacked compound parabolic concentrator, comprising:
    a parabolic array having a base, a side wall, and an aperture for receiving light;
    multiple dielectric layers within the array, each dielectric layer having a refractive index, wherein the refractive index decreases with each dielectric layer moving from the base of the parabolic array to the light receiving aperture;
    a diffuser disposed between the base and the multiple dielectric layers;
    a photovoltaic device, wherein the photovoltaic is located on the base of the parabolic array, and
    wherein the diffuser is disposed on a portion of the base of the parabolic array not including the photovoltaic device.

16. The concentrator of claim 15, wherein the parabolic array comprises at least one plastic.

17. The concentrator of claim 15, wherein the parabolic array comprises a superposition of two parabolas along a vertical axis.

18. The concentrator of claim 15, wherein the parabolic array comprises a superposition of two parabolas along a vertical axis combined with a superposition of two parabolas along a horizontal axis.

19. The concentrator of claim 18, wherein the horizontal axis is located between two of the dielectric layers within the array.

20. The concentrator of claim 15, wherein the base has a rectangular or square shape.

21. The concentrator of claim 15, wherein the side wall has a height no greater than one-half of at least one length of the base.

22. The concentrator of claim 15, wherein the multiple dielectric layers comprise at least two dielectric layers.

23. The concentrator of claim 22, wherein the multiple dielectric layers further comprise at least three dielectric layers.

24. The concentrator of claim 23, wherein the multiple dielectric layers further comprise at least four dielectric layers.

25. The concentrator of claim 15, wherein at least one dielectric layer comprises PMMA or titanium oxide.

26. The concentrator of claim 15,
 wherein the photovoltaic device has an area smaller than the area of the base.

27. The concentrator of claim 26, wherein the photovoltaic device comprises an array of GaAs solar cells.

28. The concentrator of claim 26, wherein the photovoltaic device has an area no more than two-thirds of the area of the base.

29. The concentrator of claim 26, wherein the diffuser comprises at least one of ground glass, nanoparticle arrays, or microlens arrays.

30. The concentrator of claim 15, further comprising:
 a reflecting film,
 wherein the reflecting film is disposed on at least one of the side wall or the base.

31. The concentrator of claim 30, wherein the reflecting film comprises at least one of silver or aluminum.

32. The concentrator of claim 30, wherein the reflecting film is integrated with at least one of the side wall or the base.

* * * * *